US 6,674,085 B2

(12) United States Patent
Miura et al.

(10) Patent No.: US 6,674,085 B2
(45) Date of Patent: Jan. 6, 2004

(54) GAS-ACTUATED STAGES INCLUDING REACTION-FORCE-CANCELING MECHANISMS FOR USE IN CHARGED-PARTICLE-BEAM MICROLITHOGRAPHY SYSTEMS

(75) Inventors: Takaharu Miura, Yamato (JP); Keiichi Tanaka, Ageo (JP)

(73) Assignee: Nikin Corporation, Tokyo (JP)

( * ) Notice: Subject to any disclaimer, the term of this patent is extended or adjusted under 35 U.S.C. 154(b) by 79 days.

(21) Appl. No.: 10/003,357

(22) Filed: Nov. 14, 2001

(65) Prior Publication Data

US 2002/0085192 A1 Jul. 4, 2002

(30) Foreign Application Priority Data

Dec. 4, 2000 (JP) ........................................ 2000-368668

(51) Int. Cl.[7] ............................................... G05B 11/00
(52) U.S. Cl. .................... 250/442.11; 318/687; 355/73; 355/72; 355/76; 355/53; 355/67; 355/75; 310/12
(58) Field of Search ...................... 250/442.11; 318/687, 318/678; 355/73, 72, 76, 53, 67, 75, 12; 310/12

(56) References Cited

U.S. PATENT DOCUMENTS 6,323,494 B1 * 11/2001 Lee ........................ 250/442.11

FOREIGN PATENT DOCUMENTS

| DE | 1 250 464 | 10/1968 |
| DE | 100 36 217 A | 7/2000 |
| EP | 0 917 004 A | 11/1998 |
| EP | 01128057.5 | 11/2001 |

OTHER PUBLICATIONS

Agnes et al., "Lithographic projection Apparatus.." U.S. Pub: 2002/0005939 A1, published Jan. 17, 2002.*
Tanaka et al., "Stage Apparatus Including Non–Containing Gas Bearings.." U.S. Pub. 2002/0070699 A1, published Jun. 13, 2002.*
M.Binnard, "Apparatus and Methods for Detecting Tool–Induced Shift in Microlithography Apparatus", Pub. No. 2003/0025895 A1, Pub. Date: Feb. 6, 2003.*
U.S. patent application Ser. No. 09/899,946, Tanaka et al., filed Jul. 6, 2001.
U.S. patent application Ser. No. 09/971,506, Tanaka, filed Oct. 4, 2001.

* cited by examiner

Primary Examiner—John R. Lee
Assistant Examiner—Zia R. Hashmi
(74) Attorney, Agent, or Firm—Klarquist Sparkman, LLP

(57) ABSTRACT

Stage devices are disclosed that include gas-actuation and reaction-force-canceling mechanisms. In an embodiment, an X-axis moving guide extending in the X direction engages a lower stage via a gas bearing. Y-axis sliders (movable elements) are provided at both ends of the X-axis moving guide. A Y-axis fixed guide 8 engages each Y-axis slider via a gas bearing. Each Y-axis slider and respective fixed guide constitute a respective pneumatic actuator. Respective mounting members are provided near the ends of each fixed guide, with interposed gas bearings, and each fixed guide is slidably affixed to a base plate. An actuator for stroke correction is provided in association with each mounting member.

18 Claims, 9 Drawing Sheets

GAS-ACTUATED STAGES INCLUDING REACTION-FORCE-CANCELING MECHANISMS FOR USE IN CHARGED-PARTICLE-BEAM MICROLITHOGRAPHY SYSTEMS

FIELD

This disclosure pertains generally to microlithography methods and apparatus in which a charged particle beam such as an ion beam or electron beam is used for transferring a pattern to a suitable substrate. More specifically, the disclosure pertains to stage mechanisms for use in a charged-particle-beam (CPB) microlithography apparatus and in other apparatus that include a CPB optical system. In a CPB microlithography apparatus, the stage mechanisms are used for accurately and precisely positioning an object such as a reticle and/or lithographic substrate while imparting minimal disturbances to magnetic fields in the apparatus and suppressing reactive forces resulting from stage movements.

BACKGROUND

Microlithography is a key technique used in the manufacture of microelectronic devices such as semiconductor integrated circuits, displays, and micromachines. Currently, most microlithography is performed optically, using a beam of deep ultraviolet light. However, with the relentless demand for increased circuit density and smaller pattern linewidth, the inability of optical microlithography to continue to provide adequate pattern resolution is now quite apparent. Hence, much effort currently is being expended to develop a practical "next generation" microlithography apparatus offering substantially finer pattern resolution.

In microlithography in general, the minimum obtainable pattern linewidth is a function of the wavelength of the lithographic energy beam. Hence, to obtain smaller linewidths, the wavelength of the energy beam has had to be correspondingly reduced. In optical microlithography, the smallest wavelengths currently being used are produced by excimer lasers (150–250 nm). These wavelengths can resolve pattern linewidths in the range of 0.18 to 0.25 $\mu$m. Pattern resolution can be enhanced slightly, without reducing the wavelength, by controlling the beam-propagation atmosphere and employing certain techniques such as phase shifting and polarization control.

CPB microlithography, on the other hand, offers prospects of resolving pattern linewidths of about 70 nm, which substantially exceeds the resolution obtainable using excimer-laser wavelengths. However, even with CPB microlithography, achieving this level of performance will require that extreme measures be adopted to control extraneous influences on the charged particle beam that otherwise compromise the achievable pattern resolution.

In any type of microlithography apparatus, including CPB microlithography apparatus, it is necessary to move at least the lithographic substrate during exposure of each die on the substrate. In apparatus that project a pattern from a reticle, it also is necessary to move the reticle, usually in synchrony with movements of the substrate. Such controlled movements typically are made using a "stage." The currently favored actuator for a stage in a microlithography apparatus is an electromagnetic linear motor, which is capable of achieving extremely accurate positioning and movements, as well as high movement velocity, required for performing microlithography of fine patterns. For obtaining highly accurate data regarding stage position, high-resolution laser interferometers typically are used. The actuators also include rigid, non-contacting air bearings to guide movements of the stage in the X and Y directions with essentially zero friction. Such stages can provide a positioning accuracy of a few nanometers.

In an electron-beam microlithography apparatus (as an exemplary CPB microlithography apparatus) the electron beam can be deflected in the electron-optical system at high velocity. These deflections can be made in real time to enable the electron-optical system to correct stage-position errors. As a result of this capability, stage-position accuracy can be relaxed somewhat, on the order of a few micrometers A problem with using any type of electromagnetic actuator (e.g., linear motor) in a CPB optical system is that energization of the actuator generates fluctuating magnetic fields as the actuator moves. Any magnetic field has an effect on the trajectory of the charged particle beam in the CPB optical system. The sensitivity of the beam to magnetic fields is so exquisite that even a slight fluctuation in the magnetic field in the vicinity of the beam causes an unpredictable deflection and aberration of the beam, with a corresponding adverse effect on exposure accuracy and resolution.

In addition, whenever the actuator moves the stage, a reaction force is generated in accordance with Newton's third law. The reaction force tends to be transmitted to the support structure of the microlithography apparatus, causing a corresponding vibration of the structure. These vibrations also are transmitted to the CPB optical system where they can cause placement errors of the transferred pattern and loss of contrast.

Conventional approaches to reducing these vibrations involve diversion of the vibrations to the floor or the like using a shock absorber that operates as a low-pass filter. Also, anti-vibration mechanisms based on the principle of conservation of momentum are utilized, such as disclosed in U.S. Pat. No. 5,815,246. Unfortunately, these various approaches are insufficient.

SUMMARY

In view of the foregoing, the present invention provides, inter alia, stage devices that minimize magnetic-field disturbances of the charged particle beam, while more completely suppressing reaction forces due to stage actuation, thereby increasing the accuracy of stage-position control.

According to a first aspect of the invention, stage devices are provided. An embodiment of a stage device includes a base, a stage supported in a non-contacting manner relative to the base, and a pneumatic actuator. The pneumatic actuator is situated relative to the stage and base and is configured, whenever the pneumatic actuator is actuated by application of a gas pressure thereto, to move the stage relative to the base in a stage-movement direction so as to place the stage at a desired position relative to the base. The pneumatic actuator comprises (a) a moving element linked to the stage and a fixed element that supported in a non-contacting manner relative to the base, and (b) a momentum-conservation mechanism by which the fixed element can be driven as a counter mass in a direction opposite to the stage-movement direction in response to a driving-reaction force of the stage as applied to the moving element. The subject stage device can be, for example, a reticle stage or a substrate stage, for use in a charged-particle-beam (CPB) microlithography apparatus.

Another embodiment of a stage device includes a base, a stage, an X-direction driver, and a Y-direction driver. The stage is supported in a non-contacting manner relative to the base. The X-direction driver comprises a respective pneumatic actuator that is situated relative to the stage and base so as to move the stage in the X direction relative to the base. Similarly, the Y-direction driver comprises a respective pneumatic actuator that is situated relative to the stage and base so as to move the stage in the Y direction relative to the base. Each pneumatic actuator comprises: (a) a respective moving element linked to the stage side, (b) a respective fixed element supported in a non-contacting manner relative to the base, and (c) a momentum-conservation mechanism by which the respective fixed element can be driven as a counter mass in a direction opposite to the stage-movement direction in response to a driving-reaction force of the stage as applied to the respective moving element. In this embodiment each fixed element desirably is supported in a non-contacting manner relative to the base by a respective gas bearing comprising a differential exhaust mechanism. Furthermore, each fixed element can include a respective actuator for correcting a stroke of the respective fixed element.

According to another aspect of the invention, microlithography apparatus are provided that comprise at least one stage device as summarized above. The microlithography apparatus generally can include an illumination-optical system and a projection-optical system situated downstream of the illumination-optical system. The stage device(s) in such apparatus can be a reticle stage and/or a substrate stage.

According to another aspect of the invention, methods are provided, in the context of holding an object on a stage relative to a base, for moving and positioning the object (while being held on the stage) relative to the base. An embodiment of such a method comprises linking the stage to the base by a pneumatic actuator comprising a moving element linked to the stage and a fixed element linked to the moving element. The fixed element is supported in a non-contacting manner relative to the base. The stage is driven pneumatically so as to undergo movement in a stage-movement direction relative to the base. In response to a driving-reaction force of the stage as applied to the moving element in response to driving the stage, the fixed element is driven as a counter mass in a direction opposite to the stage-movement direction. Desirably, the fixed element is driven pneumatically.

In another embodiment of a method, the stage is linked to the base by an X-direction pneumatic actuator and a Y-direction pneumatic actuator. The X-direction pneumatic actuator comprises a respective moving element linked to the stage and a respective fixed element linked to the respective moving element, wherein the respective fixed element is supported in a non-contacting manner relative to the base. The Y-direction pneumatic actuator comprising a respective moving element linked to the stage and a respective fixed element linked to the respective moving element, wherein the respective fixed element is supported in a non-contacting manner relative to the base. The X-direction pneumatic actuator and Y-direction pneumatic actuator are driven as required to move the stage in respective X and Y stage-movement directions in an XY plane relative to the base. In response to a driving-reaction force of the stage as applied to the moving element in response to moving the stage, the fixed elements are driven (e.g., pneumatically) as respective counter masses in respective directions opposite to the stage-movement directions.

In the methods and devices summarized above that achieve movement and positioning of the stage in the XY plane, by configuring the X- and Y-direction actuators as pneumatic actuators rather than electromagnetic actuators, the problem of magnetic-field fluctuations especially near a charged particle beam is eliminated.

Conventionally, stage structures capable of movement in both the X and Y directions tend to be large and massive. Hence, reaction forces acting on the fixed elements in such devices also tend to be large. In methods and devices as summarized above, the stage and the fixed element(s) are supported relative to the base plate in respective non-contacting manners. As a result, the respective fixed elements serve as respective counter masses. This prevents the reaction forces, generated as the stage is being driven, from being transmitted outside the stage, even if the structure of the stage is relatively large.

In any of the devices summarized above, each fixed element desirably is supported relative to the base plate in a non-contacting manner. This desirably is achieved using respective air bearings equipped with differential exhaust mechanisms. A gas bearing has extremely low contact resistance and creates almost no magnetic fields. Consequently, gas bearings (as used in the stage devices described herein) are superior from the standpoints of both stage controllability and absence of harmful effects on a nearby CPB optical system. Also, providing each gas bearing with a respective differential exhaust mechanism reduces air leakage, thereby allowing the stage devices to be used in a vacuum chamber.

Further with respect to the stage devices disclosed herein, the moving elements (e.g., air sliders) linked to the stage desirably are supported by respective non-contacting gas bearings (each having a respective differential exhaust mechanism) relative to the respective fixed element.

When the stage devices as disclosed herein are used in a vacuum environment where air resistance does not exist, the principle of conservation of momentum operates almost perfectly.

The foregoing and additional features and advantages of the invention will be more readily apparent from the following detailed description, which proceeds with reference to the accompanying drawings.

DETAILED DESCRIPTION

General Considerations

Figure 1:
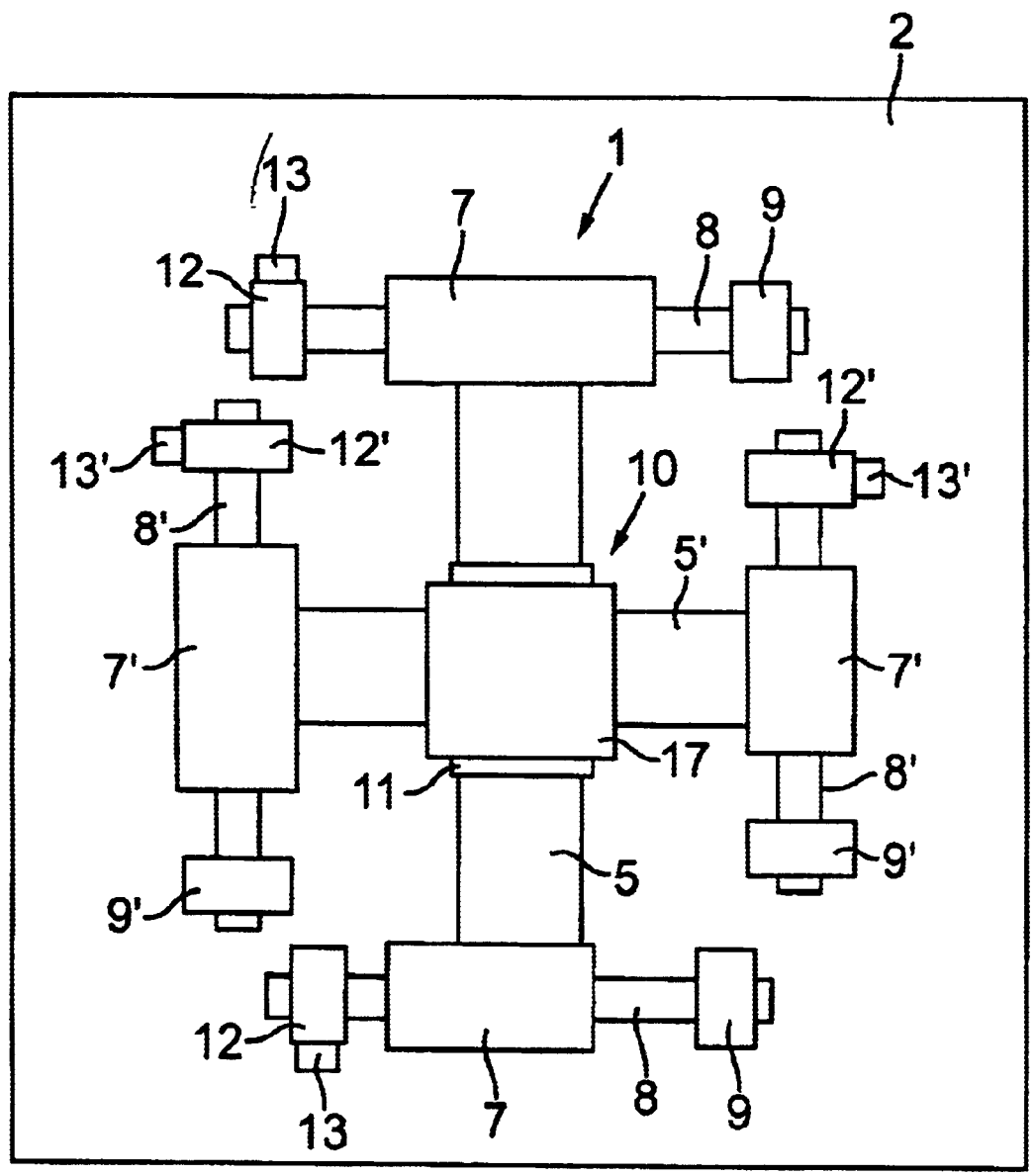
FIG. 1 is a plan view of a stage device according to a first representative embodiment.

As discussed above, the fixed element of an electromagnetic actuator creates a strong magnetic field, particularly if the fixed element is a magnet. As a result, in a conventional stage device configured for use in a charged-particle-beam (CPB) microlithography apparatus, movement of the fixed element relative to the CPB column should be minimized as much as possible. To meet this requirement, the fixed element conventionally is rigidly attached to a base plate or the like so as to reduce magnetic fluctuations.

On the other hand, it also is necessary to suppress transmission of vibrations to the CPB column during movement of the stage device. To such end, the fixed element should be attached to the base plate in a manner by which reaction forces are minimized or avoided as much as possible. This poses a contradiction: whether to attach the fixed element to the base plate rigidly or with some degree of flexibility.

To solve this problem, stage devices according to the invention utilize non-electromagnetic actuators for producing stage motions. This allows the actuators to be made of non-magnetic and electrically non-conductive materials, thereby eliminating the problem of magnetic-field fluctuations.

During stage movements, stage devices according to the invention experience reaction forces on fixed elements. The magnitude of such a reaction force is substantially equal to the magnitude of the respective stage-propulsion force acting on the movable element linked to the stage. In stage devices as disclosed herein, the stage and fixed elements are coupled to each other and to a base plate in a non-contacting manner. Consequently, the principle of conservation of momentum acts between the stage and the fixed elements, and drive forces and reaction forces tend to cancel each other. Hence, stage reaction forces generated during stage driving are not transmitted outside the stage. In this instance, the driving fixed element plays the role of a counter mass.

The non-magnetic actuators used in the stage devices disclosed herein desirably are pneumatic actuators (akin to air cylinders). Pneumatic actuators are conventionally regarded as inferior in responsiveness and positioning accuracy. However, high-accuracy position control is achieved with the stage devices disclosed herein by use of high-resolution position sensors (laser interferometers), lower-mass movable parts, and wider-band servos. Hence, stage devices as disclosed herein exhibit levels of performance that are sufficient for use in modern CPB microlithography systems.

In the present stage devices in which reaction forces are exploited in accordance with the principle of conservation of momentum, consideration is given to the mass ratio of the "moving" element versus the associated "fixed" element. Consideration also is given to the movable stroke of the moving element. For example, if the mass ratio of the moving element and fixed element is large, then a small movement of the fixed element is sufficient to cancel the reaction force. On the other hand, if the mass ratio must be limited to an extent dictated by the actual design constraints of the stage device, then corresponding minima are imposed on the movement of the fixed element. Hence, desirably, the stage device is configured to prevent the stroke of the fixed element from being excessively large. If the fixed element is returned to its original state by a separate driving means (e.g., actuator for stroke correction) during non-exposure periods in which system vibrations can be accommodated (wherein the principle of conservation of momentum acts only during exposures), then the stroke of the fixed element can be made small. Here, too, the actuator for stroke correction utilizes pressure of air (or other suitable gas) to effect the respective motions.

The invention is described below in the context of representative embodiments, which are not intended to be limiting in any way.

Figure 2:
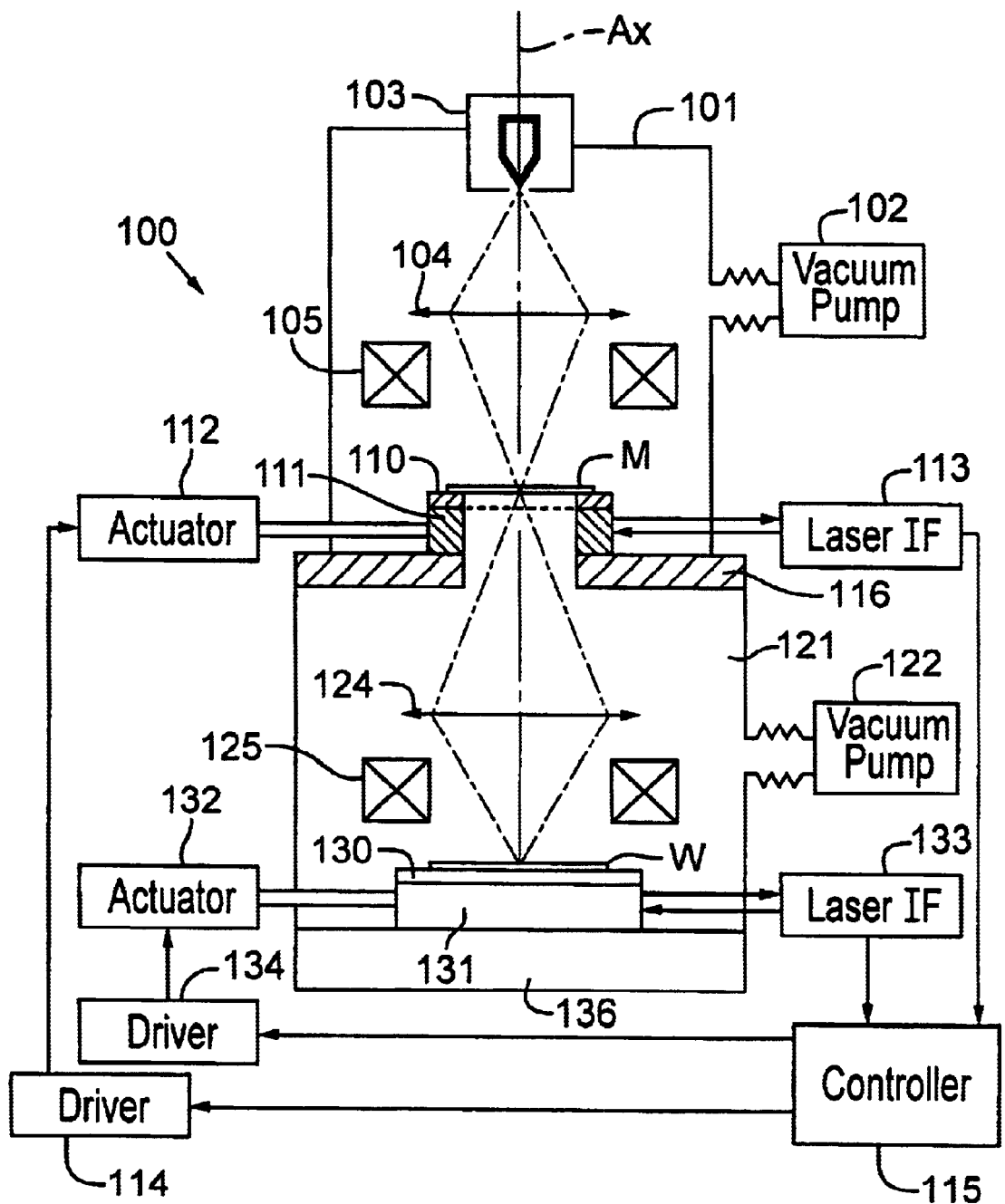
FIG. 2 is a schematic elevational view of a charged-particle-beam (specifically electron-beam) microlithography apparatus including at least one stage device according to the invention.

Reference is made first to FIG. 2 in the following description of a charged-particle-beam (CPB) microlithography (exposure) apparatus. The FIG. 2 embodiment utilizes am electron beam as the lithographic energy beam; however, it will be understood that the general principles of the apparatus are equally applicable to use of another type of charged particle beam, such as an ion beam. The apparatus 100 of FIG. 2 includes at least one stage device such as any of the embodiments described later below.

The apparatus of FIG. 2 comprises a "CPB column" 101 and a wafer chamber 121 situated downstream of the optical column 101. The CPB column 101 is connected to and evacuated to a predetermined vacuum level by a vacuum pump 102. At the extreme upstream end of the CPB column 101 is an electron gun 103 that emits an electron beam that propagates in a downstream direction (downward in the figure) along an optical axis Ax. Situated downstream of the electron gun 103 are, in sequence, a condenser lens 104, a beam deflector 105, and a reticle M. The condenser lens 104 and beam deflector 105 constitute an "illumination-optical system" configured to illuminate selected regions of the reticle M.

The electron beam emitted from the electron gun 103 is converged by the condenser lens 104 on the surface of the reticle M. The entire reticle M is not illuminated at the same instant. Rather, the reticle M is divided into exposure units termed "subfields" each defining a respective portion of the reticle pattern. The subfields are illuminated sequentially by the beam. To such end, the beam is sequentially deflected in the appropriate lateral direction in a scanning manner by the beam deflector 105. Thus, each subfield of the reticle is brought to within the optical field of the illumination-optical system and illuminated for exposure.

The reticle M is secured to a chuck 110 mounted on an upstream-facing surface of a reticle stage 111. The chuck 110 holds the reticle by, e.g., electrostatic attraction. The reticle stage 111 is supported on and moves relative to a base plate 116.

A reticle-stage actuator 112, shown in the figure on the left side of the CPB column 101, is operably connected to the reticle stage 111. The reticle-stage actuator 112 is connected to a controller 115 via a driver 114. The reticle stage 111 also is provided with at least one laser interferometer ("IF") 113. The laser interferometer 113 is connected to the controller 115. Accurate data regarding the position of the reticle stage 111 are obtained by the laser interferometer 113 and input to the controller 115. Based on these data, commands are routed from the controller 115 to the driver 114, which energizes the actuator 112 accordingly. Thus, the position and movements of the reticle stage 111 are feedback-controlled accurately and in real time.

The wafer chamber 121 is situated downstream of the base plate 116. The wafer chamber 121 defines a space that is evacuated to a desired vacuum level by a vacuum pump 122 connected to the wafer chamber 121. Situated inside the wafer chamber 121 are components of a "projection-optical system" such as a condenser lens 124 and deflector 125. Also located within the wafer chamber 121 is a lithographic substrate (termed herein a "wafer") W.

Portions of the electron beam that pass through the reticle M thus acquire an aerial image of the illuminated portion of the reticle M, and hence are termed a "patterned beam." The patterned beam is converged by the condenser lens 124 and deflected by the deflector 125 as required to form an image, corresponding to the aerial image, at a desired location on the upstream-facing surface of the wafer W.

During exposure the wafer W is secured to a chuck 130 mounted on the upstream-facing surface of a wafer stage 131. The wafer W is held to the chuck 130 by, e.g., electrostatic attraction. The wafer stage 131 is supported by and is movable relative to a base plate 136.

The wafer stage 131 is driven by a wafer-stage actuator 132, shown in the figure at the left of the wafer chamber 121, operably connected to the wafer stage 131. The wafer-stage actuator 132 is connected to the controller 115 via a driver 134. The wafer stage 131 is provided with at least one laser interferometer 133 that is connected to the controller 115. The laser interferometer 133 obtains accurate positional data concerning the wafer stage 131. These data are input to the controller 115. Based on these data, the controller 115 routes commands to the driver 134, which energizes the actuator 132 accordingly. Thus, the position and movements of the wafer stage 131 are feedback-controlled accurately and in real time.

Representative embodiments of stage devices are described below in the context of utilizing any of the stage devices in a charged-particle-beam (CPB) microlithography apparatus such as the apparatus of FIG. 2. However, it will be understood that the stages are not limited to use with a CPB microlithography apparatus. The stages also can be used for positioning of an object in any of various other systems. Furthermore, the stage devices are not limited to use in a vacuum environment. They can be used in an ambient-atmosphere environment, for example.

First Representative Embodiment

A first representative embodiment of a stage device 1 is depicted in FIG. 1, which provides a plan view of the stage device 1 mounted on a base plate 2. The stage device 1 corresponds, for example, to the wafer stage 131 in the apparatus 100 of FIG. 2. Hence, the base plate 2 corresponds to the base plate 136 shown in FIG. 2.

A platform 10 is situated in the center of the stage device 1. The platform 10 extends in the X-Y plane as shown, and comprises a lower stage 11 and an upper stage 17. The lower stage 11 and upper stage 17 are coupled together by leaf springs or similar fasteners. Although not shown in the figure, a wafer holder such as an electrostatic chuck is mounted to the "upper" surface of the upper stage 17. The wafer W is mounted to the chuck.

The lower stage 11 is movably mounted to an X-axis moving guide 5, extending in the X direction, via a gas bearing (described later with reference to FIG. 3). The ends of the X-axis moving guide 5 are mounted to respective Y-axis sliders ("moving" elements) 7 that are configured to slidably move in the Y direction on respective Y-axis fixed guides 8. The fixed guides 8 are "fixed" relative to the corresponding "moving" sliders 7. Each Y-axis fixed guide 8 extends in the Y-axis direction and engages the respective Y-axis slider 7 via respective gas bearings (described later with reference to FIG. 4). Also, each Y-axis slider 7 with its respective fixed guide 8 includes a respective pneumatic actuator (not detailed in FIG. 1 but discussed later below). The ends of the fixed guides 8 are mounted to the base plate 2 via respective mounting members 9, 12. As described later below with reference to FIGS. 5 and 6, respective non-contacting gas bearings are situated between the ends of the fixed guides 8 and the respective mounting members 9, 12. Also, as described later below with reference to FIG. 6, a respective stroke-correction actuator (including a spool valve 13) is associated with each mounting member 12.

The upper stage 17 is movably mounted to a Y-axis moving guide 5', extending in the Y direction, via a gas bearing (described later with reference to FIG. 3). The ends of the Y-axis moving guide 5' are mounted to respective X-axis sliders ("moving" elements) 7' that are configured to slidably move in the X direction on respective X-axis "fixed" guides 8'. The fixed guides 8' are "fixed" relative to the corresponding "moving" sliders 7'. Each X-axis fixed guide 8' extends in the Y-axis direction and engages the respective X-axis slider 7' via respective gas bearings (described later with reference to FIG. 4). Also, each X-axis slider 7' with its respective fixed guide 8' includes a respective pneumatic actuator (not detailed in FIG. 1 but discussed later below). The ends of the fixed guides 8' are mounted to the base plate 2 via respective mounting members 9', 12'. As discussed later below with reference to FIGS. 5 and 6, respective non-contacting gas bearings are situated between the ends of the fixed guides 8' and the respective mounting members 12'. Also, as discussed later below with reference to FIG. 6, a respective stroke-correction actuator (including a spool valve 13') is associated with each mounting member 12'.

Figure 3:
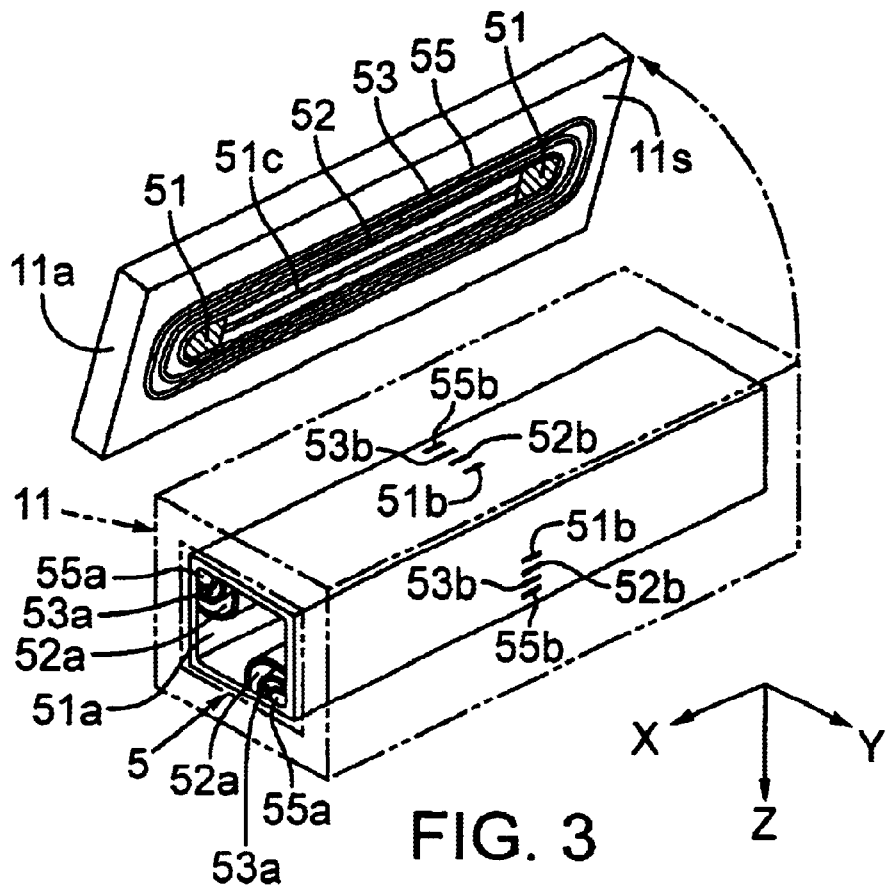
FIG. 3 is an oblique view of a gas bearing as used in the various embodiments of stage devices disclosed herein, with a portion of the bearing shown pivoted upward to reveal underlying detail. This gas bearing is described in connection with the first representative embodiment.

An exemplary gas bearing is shown in FIG. 3, depicting the lower stage 11 as engaged with the X-axis moving guide 5. In FIG. 3, the "upper" portion 11a of the lower stage is shown pivoted upward to reveal underlying detail. Although the depicted gas bearing has a desired configuration, it will be understood that the depicted configuration is exemplary only, and that any of various other configurations of gas bearings alternatively can be used. Although the bearings are discussed in the context of using air as the bearing gas, it will be understood that any of various other gases can be used. Also, it will be understood that, whereas only one gas bearing is detailed in FIG. 3, the lower stage 11 rides relative to the X-axis moving guide 5 on four identical gas bearings, wherein a respective gas bearing is associated with each of the four sides of the lower stage facing the X-axis moving guide 5.

The depicted gas bearing of FIG. 3 includes two air pads 51 each made of a porous material. The air pads 51 are defined in the "sliding surface" 11s of the upper portion 11a, and are located near respective edges of the sliding surface. Extending longitudinally between the air pads is an air-supply groove 51c defined in the sliding surface 11s. Also defined in the sliding surface 11s and surrounding the air pads and air-supply groove 51c are an atmospheric-venting guard "ring" 52, a low-vacuum guard "ring" 53, and a high-vacuum guard "ring" 55. Each of the "rings" is actually a respective channel or groove defined in the sliding surface 11s. The atmospheric-venting guard ring 52 vents air, discharged from the air pads 51, to an external site, and the low-vacuum guard ring 53 scavenges air, discharged from the air pads but not removed by the atmospheric-venting guard ring 52, to a low-vacuum pump (not shown). The high-vacuum guard ring 55 scavenges any remaining air, not otherwise scavenged by the rings 52, 53, to a high-vacuum pump (not shown). Each of the guard rings 52, 53, 55 desirably has respective semicircular ends, with respective straight longitudinal channels connecting the respective ends. The system of guard rings 52, 53, 55 associated with each gas bearing provides the respective gas bearing with a "differential exhaust mechanism."

Each gas bearing includes respective conduits for conducting air to the air pads 51 and conducting scavenged air from the guard rings 52, 53, 55. The conduits are defined inside the lumen of the X-axis moving guide 5. For example, respective high-vacuum exhaust conduits 55a extend in the longitudinal direction from the upper left and lower right of FIG. 3. Respective low-vacuum exhaust conduits 53a are defined around a portion of each respective high-vacuum exhaust conduit 55a and extend parallel to the respective high-vacuum exhaust conduit 55a in the longitudinal (X) direction. Respective atmospheric-venting conduits 52a are defined around a portion of each respective low-vacuum exhaust conduit 53a and extend parallel to the respective low-vacuum exhaust conduits 53a in the longitudinal direction. A gas-supply conduit 51a occupies the remainder of the lumen of the X-axis moving guide 5, and thus also extends in the longitudinal direction. The X-axis moving guide 5 also defines holes 51b, 52b, 53b, 55b situated at about midlength (in the X direction) and extending through the thickness dimension of the X-axis moving guide 5. The holes 51b, 52b, 53b, 55b provide respective connections between the conduits 51a, 52a, 53a, 55a and the respective groove and guard rings 51c, 52, 53, 55. Because the respective centerportions of the groove 51c and of each guard ring 52, 53, 55 are straight, each hole 51b, 52b, 53b, 55b does not become disconnected from the respective groove and guard ring 51c, 52, 53, 55 with movement of the lower stage 11 in the X direction relative to the X-axis moving guide 5. Consequently, air supply, venting, and exhaust of gas from the gas bearing is continuous.

As air is supplied from the air-supply conduit 51a to the air-supply groove 51c, air is discharged from the air pads 51. The discharged air enters the atmospheric-venting guard ring 52 and is discharged to the external atmosphere (outside the wafer chamber) via the atmospheric-venting conduit 52a. Gas leaking from the atmospheric-venting guard ring 52 is scavenged by the low-vacuum guard ring 53 and is exhausted via the low-vacuum exhaust conduit 53a. Any remaining gas enters the high-vacuum guard ring 55 and is exhausted via the high-vacuum exhaust conduit 55a. This arrangement provides efficient and thorough scavenging of gas released from the gas bearing, thereby preventing the gas from leaking into the wafer chamber 121, which is maintained at a high vacuum.

The general configuration of a pneumatic actuator is described with reference to FIG. 4, which depicts an exemplary pneumatic "chamber" 33 defined by the Y-axis slider 7 and the Y-axis fixed guide 8. The pneumatic chamber 33 is defined by hollowed-out regions of the Y-axis slider 7 surrounding a respective region of the Y-axis fixed guide 8. The pneumatic chamber 33 is flanked by air pads 51 defined in all four respective sliding surfaces of the Y-axis slider 7. Surrounding each air pad 51 is a respective atmospheric-venting guard ring 52. On each sliding surface of the Y-axis slider, the two air pads 51 with their respective atmospheric-venting guard rings 52 are surrounded by a low-vacuum guard ring 53 and a high-vacuum guard ring 55. The air discharged from the air pads and discharged into the pneumatic chamber 33 is exhausted via the guard rings 52, 53, 55. Hence, substantially no air leaks out into the wafer chamber, which is kept at a high vacuum.

The pneumatic chamber 33 is divided into two portions 33a, 33b by a partition plate 31 attached at about the center of the Y-axis fixed guide 8. The partition plate 31 extends in the XZ plane and has a defined thickness. As the partition plate 31 is disposed in the pneumatic chamber 33, a small gap exists between the distal edge of the partition plate 31 and the inner wall of the pneumatic chamber 33. The pneumatic-chamber portions 33a, 33b are supplied by gas by respective gas passages, 35 that extend longitudinally inside the Y-axis fixed guide 8 and open into the respective portion near the partition plate 31. The gas is supplied to the passages 35 from an external source via the mounting members 9, 12. By regulating the respective gas pressures supplied to the pneumatic-chamber portions 33a, 33b, the slider 7 can be driven in the Y direction relative to the Y-axis fixed guide 8. (Although not shown in FIG. 4, the Y-axis fixed guide 8 also includes respective conduits for supplying gas to the air pads 51 and for conducting away gas scavenged by the guard rings 52, 53, 55.)

Figure 5:
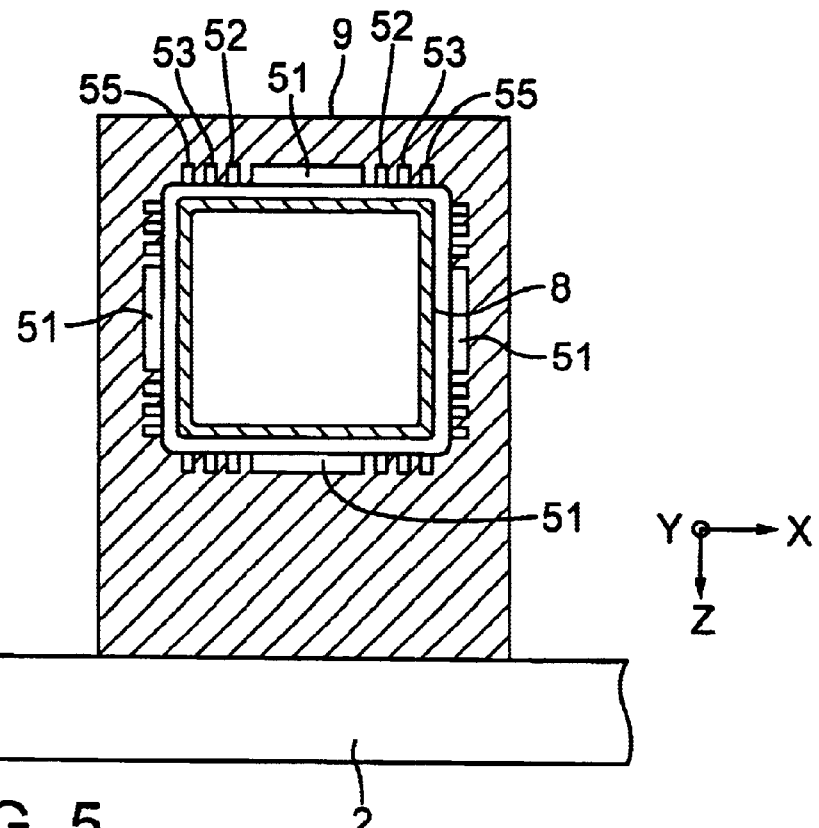
FIG. 5 is a transverse section of an exemplary mounting member and associated fixed guide, as described in connection with the first representative embodiment.

Details of a mounting member 9 (to which an end of the Y-axis fixed guide 8 is engaged in the mariner shown in FIG. 1) are shown in FIG. 5. As shown, a respective air pad 51 is defined in each interior surface (upper, lower, left, and right in the figure) of the mounting member 9. Surrounding each air pad 51 are, in sequence, a respective atmospheric-venting guard ring 52, a respective low-vacuum guard ring 53, and a respective high-vacuum guard ring 55. In the manner discussed earlier above, air discharged from each air pad 51 is scavenged by the respective guard rings 52, 53, 55, thereby preventing any substantial leaking of air into the wafer chamber, which is kept at a high vacuum. Thus, the Y-axis fixed guides 8 are mounted in the respective mounting members 9 in a manner such that the corresponding fixed portions of the respective pneumatic actuators are slidably supported with no physical contact and substantially zero frictional resistance relative to the base plate 2.

Figure 6:
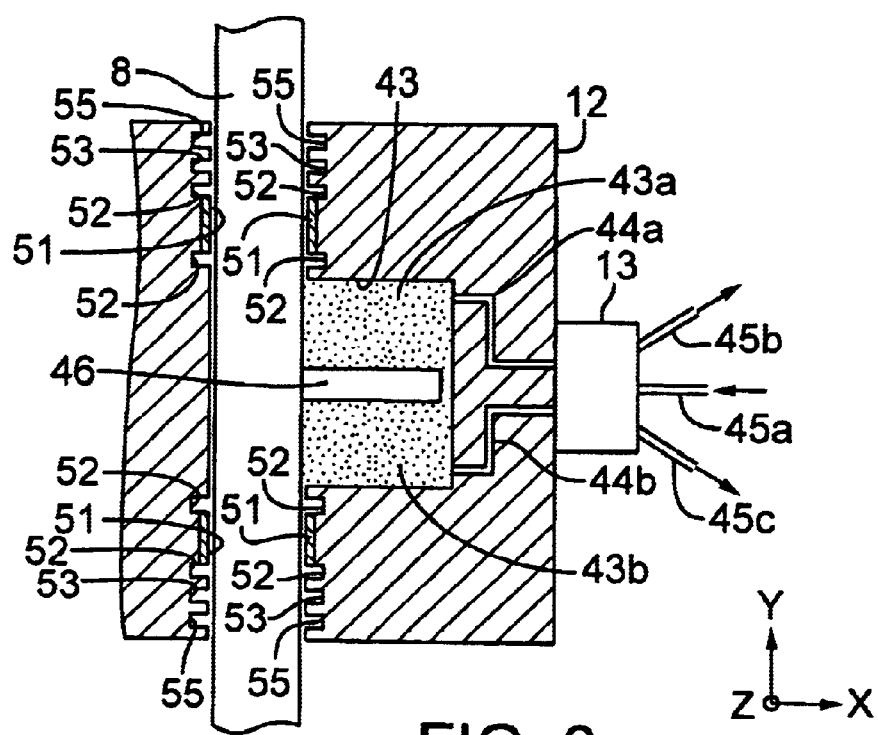
FIG. 6 is a plan section showing details of a pneumatic actuator as used for stroke correction, as described in connection with the first representative embodiment.

Details of a stroke-correction actuator are described with reference to FIG. 6. The depicted stroke-correction actuator includes a spool valve 13. The spool valve 13 is mounted to a side of the respective mounting member 12. The respective end of the Y-axis fixed guide 8 is situated relative to the mounting member 12 in the manner shown. As can be discerned from the figure, the mounting member 12 and Y-axis fixed guide 8 define a respective gas "chamber" 43 for performing stroke correction.

The pneumatic chamber 43 is defined as an interiorly hollowed-out region, in a respective sliding surface of the mounting member 12, adjacent the spool valve 13. Gas conduits 44a, 44b extend through the mounting member 12 from respective portions 43a, 43b of the pneumatic chamber 43 to the spool valve 13. Connected to the spool valve 13 are a supply conduit 45a for supplying gas and exhaust conduits 45b, 45c for exhausting gas.

Defined on the sliding surfaces are air pads 51 that are configured in the same manner as those shown in FIG. 5. Respective air pads 51 are provided adjacent each pneumatic-chamber portion 43a, 43b. Each air pad 51 is surrounded by a respective atmospheric-venting guard ring 52, a respective low-vacuum guard ring 53, and a respective high-vacuum guard ring 55, which scavenge air discharged from the respective air pad 51. Thus, substantially no air from the air pads 51 leaks into the wafer chamber, which is kept at a high vacuum.

A partition plate 46 extends in the X direction into the pneumatic chamber 43 from the Y-axis fixed guide 8. The partition plate 46 has a plate-like configuration, extending in the XZ plane and having a defined thickness. A defined gap exists between the distal end of the partition plate 46 and the opposing interior surface of the mounting member 12. Thus, the partition plate 46 divides the pneumatic chamber 43 into the portions 43a, 43b. By controllably manipulating the spool valve 13 and regulating the pressure of gas supplied to the pneumatic-chamber portions 43a and 43b, the Y-direction position (stroke) of the Y-axis fixed guide 8 is corrected.

Figure 7:
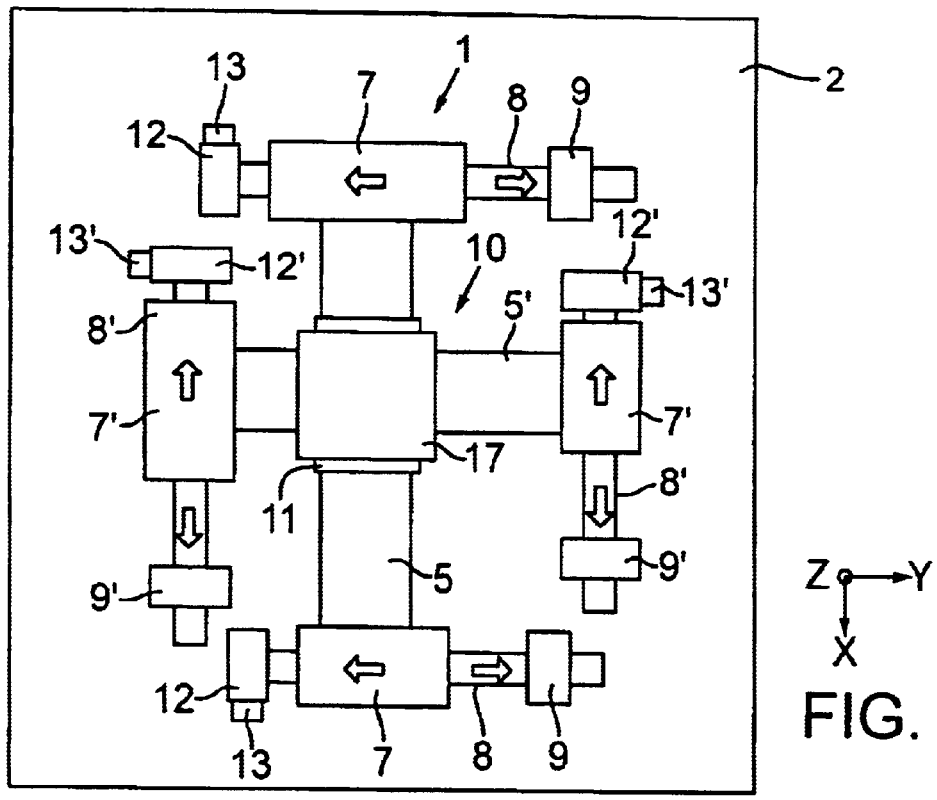
FIG. 7 is a plan view of the stage device of the first representative embodiment, showing exemplary stage movements.

By way of example, FIG. 7 depicts certain aspects of movement of the stage device 1 as the upper and lower stages 11, 17, respectively, are driven in the negative X and Y directions. During such driving of the stages 11, 17 the sliders 7, 7' are moved in the XY plane by corresponding actuations of respective pneumatic actuators (see FIG. 4). In FIG. 7 the slider 7 slides in the negative Y direction, and the slider 7' slides in the negative X direction (note arrows). As a result of these motions, respective reaction forces are applied to the fixed guides 8, 8' in respective directions opposite the movement directions of the sliders 7, 7'. As discussed above, the fixed guides 8, 8' are mounted to the base plate 2 via gas bearings in the respective mounting members 9, 12 and 9', 12' (see FIGS. 5 and 6). These mountings allow the fixed guides 8 to slide reactively in the positive Y direction and the fixed guides 8' to slide reactively in the positive X direction (note arrows in FIG. 7). These reactive sliding motions of the fixed guides 8, 8' effectively cancel the reaction force of the sliders 7, 7'. Thus, the fixed guides 8, 8' collectively provide a momentum-conservation mechanism (counter mass) for the stage device.

After being moved reactively as described above, the fixed guides 8, 8' are returned to their respective original positions by controlled manipulations of the spool valve 13 (FIG. 6) whenever exposure scanning is not occurring.

Second Representative Embodiment

Figure 8:
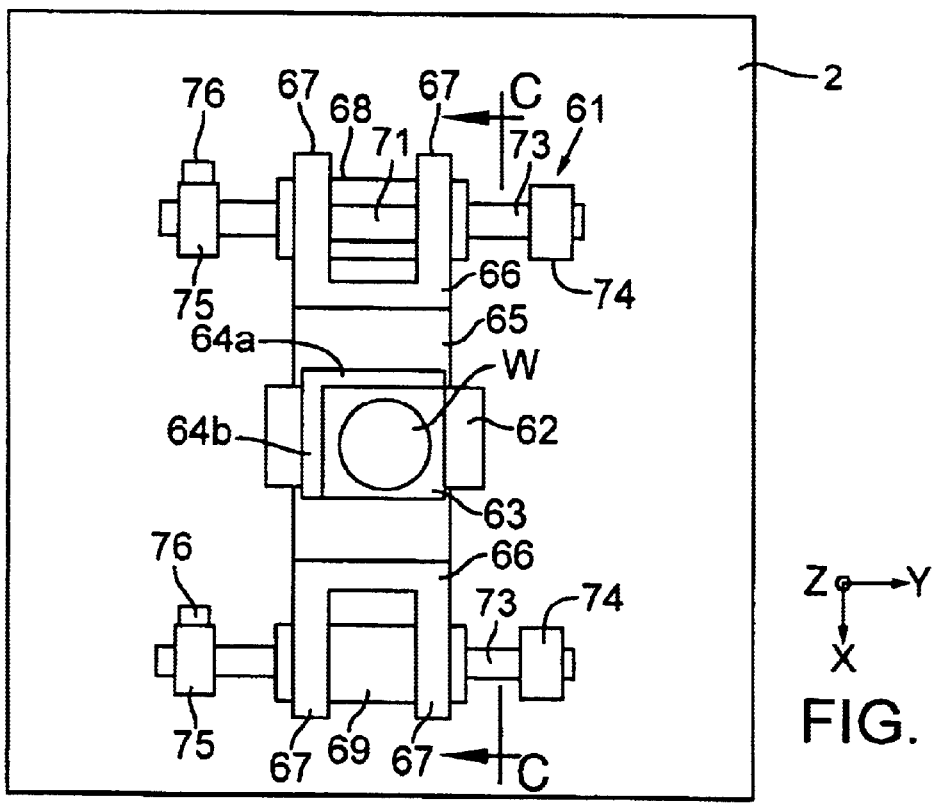
FIG. 8 is a plan view of a stage device according to a second representative embodiment.
Figure 9:
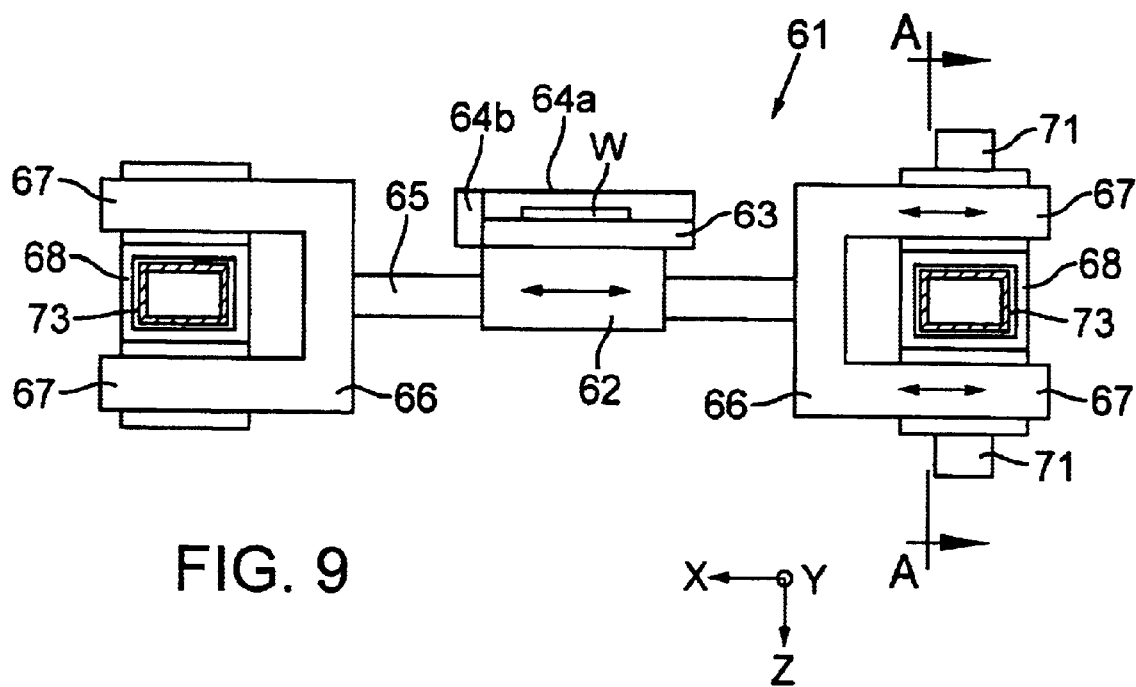
FIG. 9 is a sectional view along the line C—C in FIG. 8.

A second representative embodiment of a stage device is depicted in FIGS. 8 and 9. In this embodiment the stage platform is supported and moved on one moving guide. The moving guide is configured to bridge two sliders that slide along the Y axis. In FIGS. 8 and 9, the stage device 61 is mounted on a base plate 2 that corresponds to the base plate 136 in FIG. 2. The stage device 61 includes a movable platform 62 configured as a hollow box. A wafer table 63 configured to hold a wafer W is mounted to the upstream-facing surface of the platform 62. Although not shown, the wafer W actually is mounted to the wafer table 63 by a wafer-holding device such as an electrostatic chuck. At least two sides (X side and Y side) of the wafer table 63 are provided with respective "moving mirrors" 64a, 64b. The moving mirrors 64a, 64b have respective surfaces that are highly polished to serve as respective reflective surfaces for the laser interferometer 133 (FIG. 2).

The platform 62 is mounted via a gas bearing (not shown in FIG. 8) to an X-axis moving guide 65 that extends in the X direction. The platform 62 and the X-axis moving guide 65 collectively define a respective pneumatic actuator (see FIG. 4). The platform 62 is driven in the X direction by controllably applying differential gas pressures across a partition plate in the pneumatic actuator inside the X-axis moving guide 65.

Respective yokes 66 are mounted to the ends of the X-axis moving guide 65. Each yoke 66 defines four respective parallel slider-engagement members 67 oriented away from the platform 62. Respective sliders (movable elements) 68, 69 (described later with reference to FIG. 10) having a conforming stepped structure engage the four slider-engagement members 67 of each yoke 66 via respective gas bearings (not shown). A spool valve 71 is provided at the "upper" and "lower" surfaces of the slider 68. The spool valve 71 serves to correct the X-direction position (stroke) of the X-axis moving guide 65 (described later with reference to FIG. 11).

Respective Y-axis fixed guides 73, each extending in the Y direction, engage the sliders 68, 69 via respective gas bearings (not shown). Each slider 68 and its respective fixed guide 73 define a respective pneumatic actuator (see FIGS. 4 and 10). The fixed guides 73 are mounted to the base plate 2 via mounting members 74, 75 provided near respective ends of each fixed guide 73. Between each end of each fixed guide 73 and the respective mounting member 74, 75 is a respective gas bearing (see FIGS. 5 and 6). Thus, each fixed guide 73 is slidably mounted to the base plate 2. A respective spool valve 76 is associated with each mounting member 75.

Figure 10:
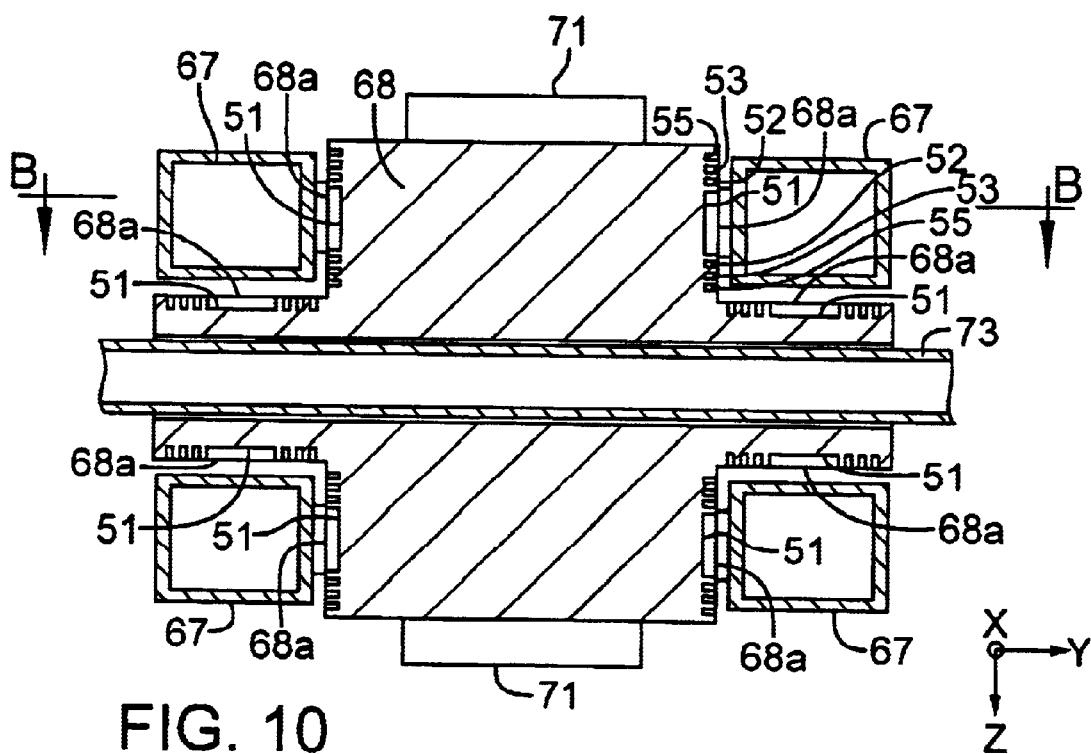
FIG. 10 is a sectional view along the line A—A in FIG. 9.
Figure 11:
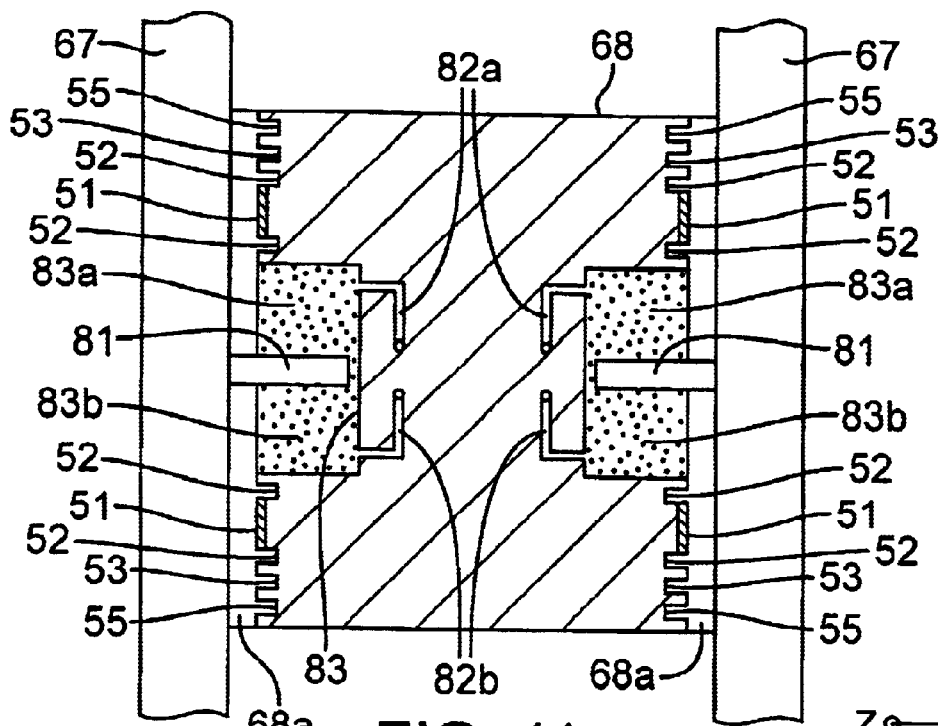
FIG. 11 is a sectional view along the line B—B in FIG. 10.

Further details of this representative embodiment are depicted in FIGS. 10 and 11. FIG. 10 is a section along the line A—A in FIG. 9, thereby providing details of the slider 68, and FIG. 11 is a section along the line B—B in FIG. 10. The slider 68 is engaged with the Y-axis fixed guide 73 at about the median of the fixed guide 73. The slider 68 and fixed guide 73 define a respective pneumatic actuator (not shown, but see FIG. 4). The slider defines four stepped portions 68a each engaging a respective slider-engagement member 67 with an intervening gap. Each such gap is established by two respective air pads 51 defined in each surface of the respective stepped portion 68a facing the respective slider-engagement member 67 (FIG. 10 depicts only one air pad 51 on each facing surface of each stepped portion 68a). Gas discharged from the air pads 51 enables the respective slider-engagement members 67 to move with substantially zero friction relative to the slider 68. Surrounding each air pad 51 are, in sequence, a respective atmospheric-venting guard ring 52, a respective low-vacuum guard ring 53, and a respective high-vacuum guard ring 55. Thus, air from the air pads is effectively scavenged to avoid leakage of the air into the wafer chamber, which is kept at a high vacuum.

FIG. 11 depicts details of a pneumatic actuator (for stroke correction) situated between the slider 68 and opposing slider-engagement members 67. The drawing depicts two pneumatic actuators 83 situated at the "top" of the slider 68. It will be understood that two additional pneumatic actuators are situated at the "bottom" of the slider 68, yielding a total of four. Hence, whereas the following description is directed to the "upper" pneumatic actuators, it will be understood that the "lower" pneumatic actuators have similar configurations.

Referring to FIG. 11, each pneumatic actuator 83 is defined in a respective hollowed-out region in a respective stepped portion 68a of the slider 68. Each pneumatic actuator 83 is served by respective gas conduits 82a, 82b extending through the body of the slider 68. The gas conduits 82a, 82b extend from the respective pneumatic actuator 83 to the respective spool valve 71 (see FIGS. 8–10).

Each pneumatic actuator 83 is flanked by respective air pads 51 (FIG. 5). Surrounding each air pad 51 are, in sequence, a respective atmospheric-venting guard ring 52, a respective low-vacuum guard ring 53, and a respective high-vacuum guard ring 55. Air discharged from the pneumatic actuator 83 and respective air pad is scavenged by the respective guard rings. As a result, substantially no air leaks into the wafer chamber, which is kept at a high vacuum.

Each pneumatic actuator 83 includes a respective partition plate 81 attached to and extending from a respective location on the respective slider-engagement member 67 toward the respective stepped portion 68a. Each partition plate 81 is configured as a plate extending in the YZ plane and having a defined thickness. The partition plate 81 extends into the respective pneumatic actuator 83 with a gap between the distal edge of the partition plate 81 and the opposing interior wall of the pneumatic actuator 83. Thus, the partition plate 81 effectively divides the respective pneumatic actuator 83 into two chamber portions 83a, 83b. By manipulating the spool valve 71 in a controlled manner, the differential pressure of gas in the chamber portions 83a, 83b is controlled in a manner causing a desired movement of the slider-engagement member 67 relative to the slider 68. Thus, the X-direction position (stroke) of the slider-engagement member 67 is corrected.

Figure 12:
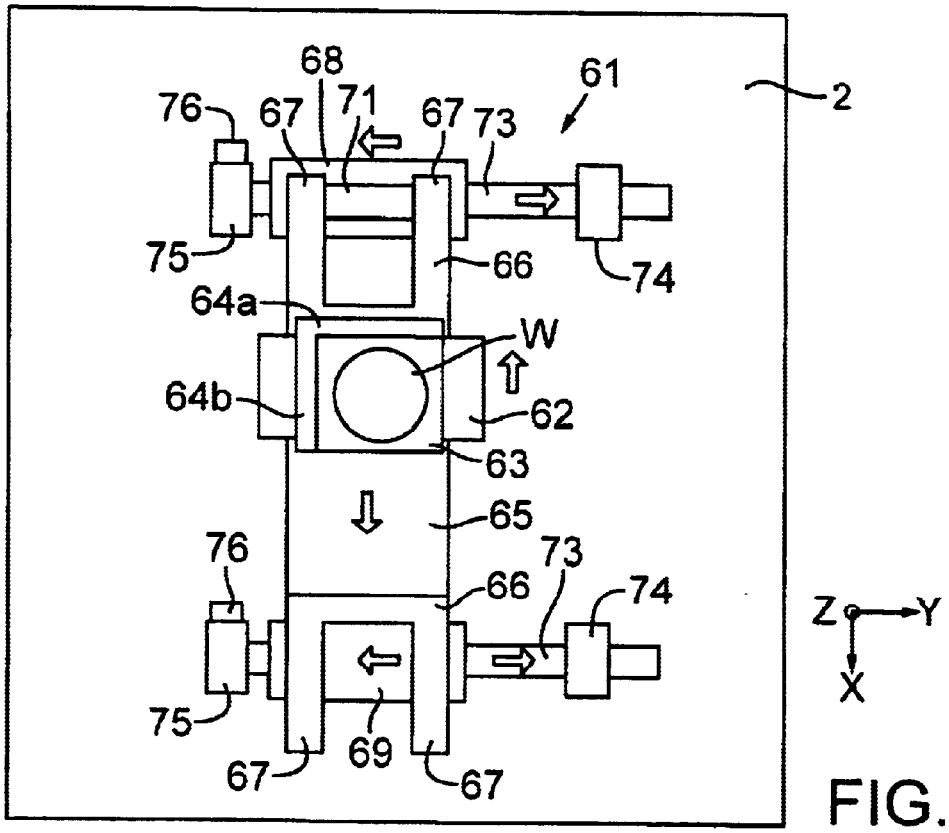
FIG. 12 is a plan view of the stage device of the second representative embodiment, showing exemplary stage movements.

FIG. 12 is a plan view showing exemplary movements when driving the stage device of this second representative embodiment. Specifically, FIG. 12 depicts movements of the stage device 61 whenever the platform 62 (FIG. 8) is driven in the negative X and Y directions.

Whenever the platform is driven in the X direction, the pneumatic actuator associated with the platform 62 and the X-axis moving guide 65 is driven, causing the platform 62 to slide in the negative X direction. This motion imposes a reactive force on the X-axis moving guide 65 and slider-engagement members 67 in the opposite direction. As noted above, the X-axis moving guide 65 is supported by the slider 68 via respective gas bearings (FIG. 10). Hence, in FIG. 12 the X-axis moving guide 65 slides in the positive X direction, which cancels the reactive force of the platform 62. Thus, the X-axis moving guide 65 provides a momentum-conservation mechanism (counter mass).

Whenever the stage platform 62 is being driven in the Y direction, the respective pneumatic actuators associated with the sliders 68, 69 and the fixed guide 73 are driven (FIG. 10). In FIG. 12 the platform 62 and sliders 68, 69 slide in the negative Y direction. This motion imposes a reactive force on the fixed guide 73 in the opposite direction. As noted above, the sliders 68, 69 are supported by the fixed guide 73 via respective gas bearings (FIG. 10). Hence, in FIG. 12 the fixed guide 73 slides in the positive Y direction, which cancels the reactive force on the platform 62. Thus, the fixed guide 73 provides a momentum-conservation mechanism (counter mass).

The positions of the X-axis moving guide 65 and the fixed guide 73 after being moved by the reactive forces are returned to their respective original positions by controlled manipulations of the spool valves 71, 76 (FIG. 8) whenever exposure scanning is not occurring.

Third Representative Embodiment

Figure 13:
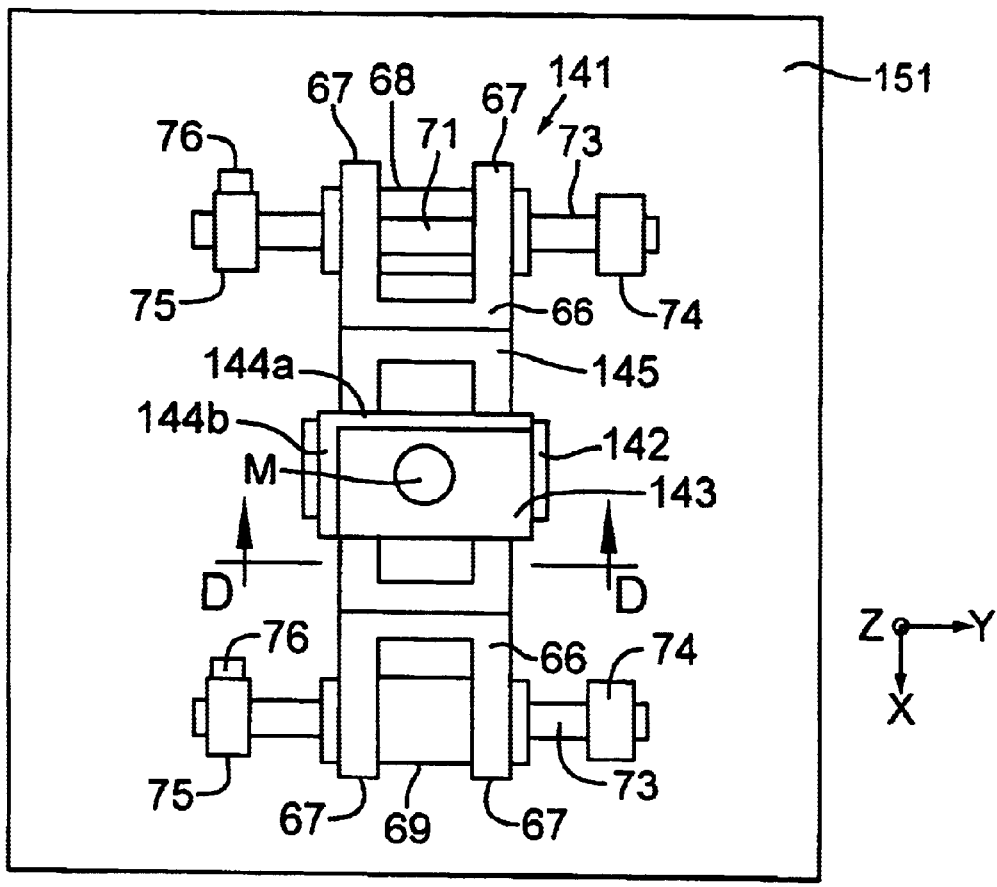
FIG. 13 is a plan view of a stage device according to a third representative embodiment.
Figure 14:
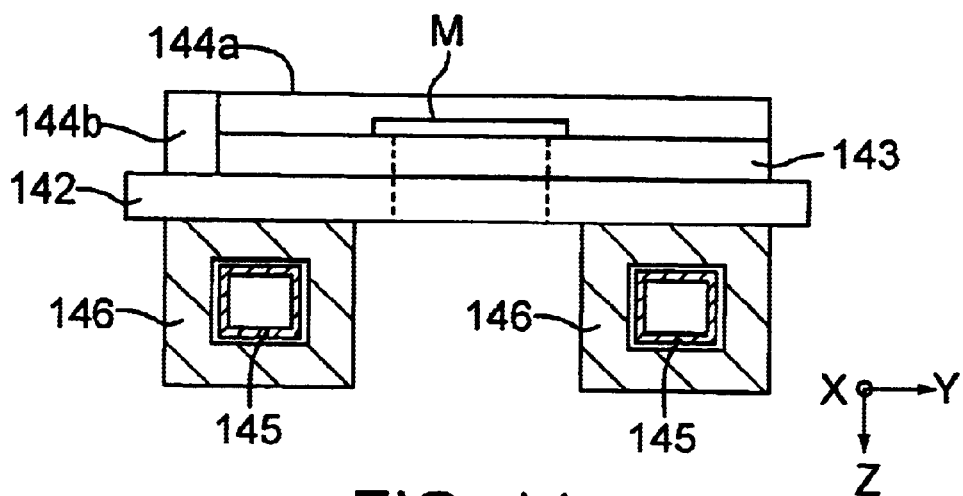
FIG. 14 is a sectional view along the line D—D in FIG. 13.
Figure 15:
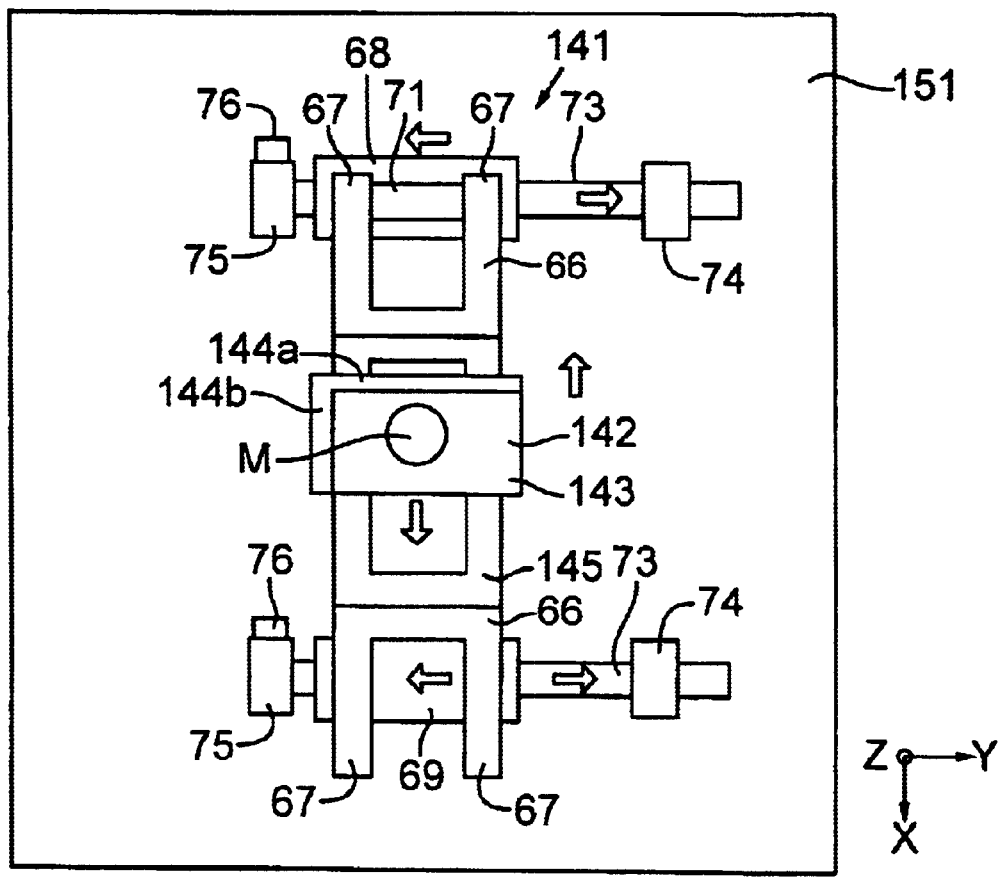
FIG. 15 is a plan view of the stage device of the third representative embodiment, showing exemplary stage movements.

A third representative embodiment of a stage device is shown in FIGS. 13–15. In this embodiment the subject stage device can be used as a reticle stage. FIG. 13 shows the subject stage device 141 mounted on the base plate 116 (FIG. 2). The stage device 141 corresponds to the reticle stage 111 in the apparatus of FIG. 2. Even though the stage device 141 is an exemplary reticle stage, most of the stage device 141 is configured similarly to the stage device 61 of the second representative embodiment. Hence, components that are similar to respective components in the second representative embodiment have the same respective reference numerals and are not described further below.

Referring to FIG. 13, a movable platform 142 having a defined thickness is situated at about the middle of the stage device 141. A reticle table 143 is mounted to the upstream-facing surface of the platform 142. In the center of the reticle table 143 and platform 142 a through-hole, extending in the Z direction, is defined to provide a propagation path for the exposure beam. Although not shown in FIG. 13, a reticle holder (e.g., electrostatic chuck or the like) is mounted to the upstream-facing surface of the reticle table 143. The reticle M is mounted to the reticle holder. Respective moving mirrors 144a, 144b are mounted along at least two sides of the reticle table 143. The moving mirrors 144a, 144b are highly polished and are used as reflective surfaces for the laser interferometer 113 shown in FIG. 2.

As shown in FIG. 14, two "cylinders" 146 extend in the X direction beneath the platform 142. Engaged with each cylinder 146 is a respective X-axis moving guide (fixed element) 145. Between the engagement surfaces (extending in the X direction in FIG. 14) of each cylinder and moving guide 145 are respective gas bearings (not shown). Each X-axis moving guide 145 has a rectilinear transverse (YZ) profile, with an open center. A yoke 66 (FIG. 8) is attached to each end of the X-axis moving guide 145.

Figure 4:
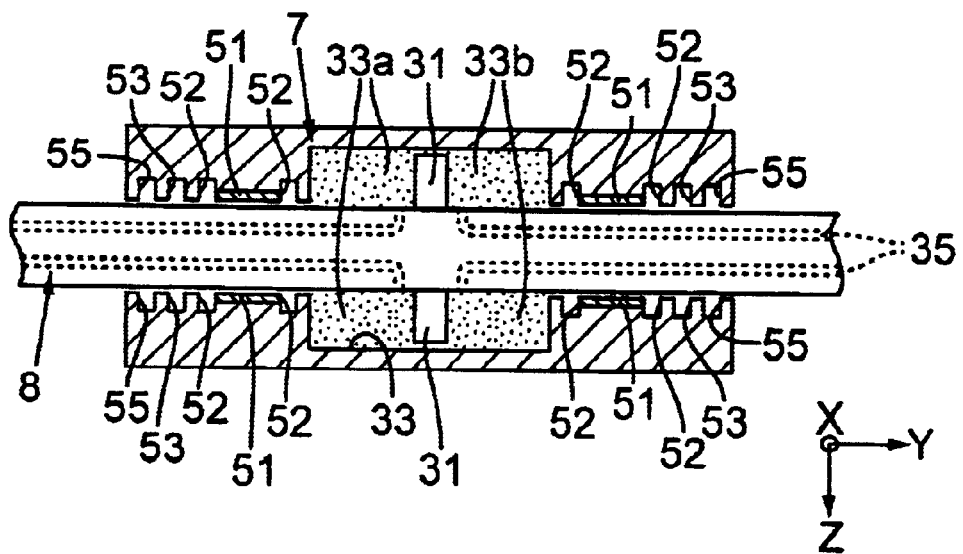
FIG. 4 is an elevational section showing exemplary details of a pneumatic actuator as used in the various embodiments of stage devices disclosed herein. This pneumatic actuator is described in connection with the first representative embodiment.

A pneumatic actuator such as that shown in FIG. 4 is associated with each cylinder 146 and the respective portion of the X-axis moving guide 145 extending in the X direction. The platform 142 is driven in the X direction by controllably applying differential pressures to the pneumatic actuators inside each cylinder 146.

FIG. 15 is a plan view showing certain details associated with driving the stage device according to this third representative embodiment. By way of example, driving in the negative X and Y directions is illustrated. Whenever the platform 142 is driven in the X direction, the respective pneumatic actuator constituted by the cylinder 146 and the respective portion of the X-axis moving guide 145 extending in the X direction is actuated. In FIG. 15, the platform 142 is shown sliding in the negative X direction. This motion causes a reactive force to be applied to the X-axis moving guide 145 and slider-engagement member 67 in the direction opposite the movement direction of the platform 142. Since the X-axis moving guide 145 is fixed by the slider 68 with interposed respective gas bearings (FIG. 10), in FIG. 15 the X-axis moving guide 145 reactively slides in the positive X direction. Thus, the reactive force of the stage 142 is canceled. In this instance the X-axis moving guide 145 acts as a momentum-conservation mechanism (counter mass).

Whenever the platform 62 is driven in the Y direction, the fixed guide 73 acts as a momentum-conservation mechanism (counter mass) in the same manner as in the stage device 61 shown in FIG. 8.

As understood from the foregoing, the various stage devices according to the invention minimize magnetic-field disturbances, suppress reaction forces due to stage motions, and thus provide controlled stage positions with increased accuracy.

Whereas the invention has been described in connection with multiple representative embodiments, it will be understood that the invention is not limited to those embodiments. On the contrary, the invention is intended to encompass all alternatives, modifications, and equivalents as may be included within the spirit and scope of the invention, as defined by the appended claims.

What is claimed is:

1. A stage device, comprising:

a base;

a stage supported in a non-contacting manner relative to the base; and a pneumatic actuator situated relative to the stage and base and configured, whenever the pneumatic actuator is actuated by application of a gas pressure thereto, to move the stage relative to the base in a stage-movement direction so as to place the stage at a desired position relative to the base, the pneumatic actuator comprising (a) a moving element linked to the stage and a fixed element that supported in a non-contacting manner relative to the base, and (b) a momentum-conservation mechanism by which the fixed element can be driven as a counter mass in a direction opposite to the stage-movement direction in response to a driving-reaction force of the stage applied to the moving element.

2. The stage device of claim 1, configured as a reticle stage for a charged-particle-beam microlithography apparatus.

3. The stage device of claim 1, configured as a substrate stage for a charged-particle-beam microlithography apparatus.

4. A stage device for moving and positioning a stage in an XY plane, comprising:
- a base;
- a stage supported in a non-contacting manner relative to the base;
- an X-direction driver comprising a respective pneumatic actuator situated relative to the stage and base so as to move the stage in the X direction relative to the base;
- a Y-direction driver comprising a respective pneumatic actuator situated relative to the stage and base so as to move the stage in the Y direction relative to the base; and
- each pneumatic actuator comprising (a) a respective moving element linked to the stage side, (b) a respective fixed element supported in a non-contacting manner relative to the base, and (c) a momentum-conservation mechanism by which the respective fixed element can be driven as a counter mass in a direction opposite to the stage-movement direction in response to a driving-reaction force of the stage applied to the respective moving element.

5. The stage device of claim 4, wherein each fixed element is supported in a non-contacting manner relative to the base by a respective gas bearing comprising a differential exhaust mechanism.

6. The stage device of claim 4, wherein each fixed element comprises a respective actuator for correcting a stroke of the respective fixed element.

7. A microlithography apparatus, comprising a stage device as recited in claim 1.

8. A charged-particle-beam microlithography apparatus, comprising:
- an illumination-optical system;
- a projection-optical system situated downstream of the illumination-optical system; and
- a stage device, comprising (a) a base, (b) a stage supported in a non-contacting manner relative to the base, and (c) a pneumatic actuator situated relative to the stage and base and configured, whenever the pneumatic actuator is actuated by application of a gas pressure thereto, to move the stage relative to the base in a stage-movement direction so as to place the stage at a desired position relative to the base, the pneumatic actuator comprising (i) a moving element linked to the stage and a fixed element that supported in a non-contacting manner relative to the base, and (ii) a momentum-conservation mechanism by which the fixed element can be driven as a counter mass in a direction opposite to the stage-movement direction in response to a driving-reaction force of the stage applied to the moving element.

9. The apparatus of claim 8, wherein the stage device is configured as a reticle stage.

10. The apparatus of claim 8, wherein the stage device is configured as a substrate stage.

11. A microlithography apparatus, comprising a stage device as recited in claim 4.

12. A charged-particle-beam microlithography apparatus, comprising:
- an illumination-optical system;
- a projection-optical system situated downstream of the illumination-optical system; and
- a stage device, comprising (a) a base, (b) a stage supported in a non-contacting manner relative to the base, (c) an X-direction driver comprising a respective pneumatic actuator situated relative to the stage and base so as to move the stage in the X direction relative to the base, and (d) a Y-direction driver comprising a respective pneumatic actuator situated relative to the stage and base so as to move the stage in the Y direction relative to the base, wherein each pneumatic actuator comprises (i) a respective moving element linked to the stage side, (ii) a respective fixed element supported in a non-contacting manner relative to the base, and (iii) a momentum-conservation mechanism by which the respective fixed element can be driven as a counter mass in a direction opposite to the stage-movement direction in response to a driving-reaction force of the stage applied to the respective moving element.

13. The apparatus of claim 12, wherein the stage device is configured as a reticle stage.

14. The apparatus of claim 12, wherein the stage device is configured as a substrate stage.

15. In a method for holding an object on a stage relative to a base, a method for moving and positioning the object, while being held on the stage, relative to the base, the method comprising:
- linking the stage to the base by a pneumatic actuator comprising a moving element linked to the stage and a fixed element linked to the moving element, the fixed element being supported in a non-contacting manner relative to the base;
- pneumatically driving the stage to move in a stage-movement direction relative to the base; and
- in response to a driving-reaction force of the stage as applied to the moving element in response to driving the stage, driving the fixed element as a counter mass in a direction opposite to the stage-movement direction.

16. The method of claim 15, wherein the fixed element is driven pneumatically.

17. In a method for holding an object on a stage relative to a base, a method for moving and positioning the object, while being held on the stage, relative to the base, the method comprising:
- linking the stage to the base by (a) an X-direction pneumatic actuator comprising a respective moving element linked to the stage and a respective fixed element linked to the respective moving element, the respective fixed element being supported in a non-contacting manner relative to the base, and (b) a Y-direction pneumatic actuator comprising a respective moving element linked to the stage and a respective fixed element linked to the respective moving element, the respective fixed element being supported in a non-contacting manner relative to the base;
- pneumatically actuating the X-direction pneumatic actuator and Y-direction pneumatic actuator as required to move the stage in respective X and Y stage-movement directions in an XY plane relative to the base; and
- in response to a driving-reaction force of the stage as applied to the moving element in response to moving the stage, driving the fixed elements as respective counter masses in respective directions opposite to the stage-movement directions.

18. The method of claim 16, wherein the fixed elements are driven pneumatically.

* * * * *

UNITED STATES PATENT AND TRADEMARK OFFICE
CERTIFICATE OF CORRECTION

PATENT NO. : 6,674,085 B2
DATED : January 6, 2004
INVENTOR(S) : Miura et al.

It is certified that error appears in the above-identified patent and that said Letters Patent is hereby corrected as shown below:

Title page,
Item [73], Assignee, "Nikin Corporation" should read -- Nikon Corporation --.
Item [56], References Cited, FOREIGN PATENT DOCUMENTS, "DE 1 250 464" should read -- GB 1 250 464 --.

Column 2,
Line 12, "micrometers" should read -- micrometers. --.
Line 57, "that supported" should read -- that is supported --.

Column 6,
Line 28, "utilizes am" should read -- utilizes an --.

Column 10,
Line 31, "mariner" should read -- manner --.

Column 14,
Line 62, "that supported" should read -- that is supported --.

Signed and Sealed this

Eighth Day of February, 2005

JON W. DUDAS
*Director of the United States Patent and Trademark Office*